(12) United States Patent  
Seo

(10) Patent No.: US 8,610,362 B2  
(45) Date of Patent: Dec. 17, 2013

(54) LIGHTING DEVICE

(75) Inventor: Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 211 days.

(21) Appl. No.: 13/298,558

(22) Filed: Nov. 17, 2011

(65) Prior Publication Data

US 2012/0126723 A1    May 24, 2012

(30) Foreign Application Priority Data

Nov. 19, 2010  (JP) ................................ 2010-259252

(51) Int. Cl.
 *H05B 37/02*    (2006.01)

(52) U.S. Cl.
 USPC ............................ 315/192; 315/297; 315/312

(58) Field of Classification Search
 USPC ......................... 315/192, 210, 294, 297, 312
 See application file for complete search history.

(56) References Cited

U.S. PATENT DOCUMENTS

| | | | |
|---|---|---|---|
| 6,661,029 B1 | 12/2003 | Duggal | |
| 7,233,115 B2 * | 6/2007 | Lys | 315/291 |
| 8,030,840 B2 | 10/2011 | Kaneda et al. | |
| 8,362,712 B1 * | 1/2013 | Lebens et al. | 315/291 |
| 8,471,496 B2 * | 6/2013 | Knapp | 315/307 |
| 2008/0164827 A1 * | 7/2008 | Lys | 315/250 |
| 2010/0171440 A1 | 7/2010 | Satou et al. | |
| 2013/0002157 A1 * | 1/2013 | van de Ven et al. | 315/192 |

FOREIGN PATENT DOCUMENTS

JP    2005-317296    11/2005

OTHER PUBLICATIONS

Mitsubishi Kagaku Media Co., Ltd., "World's First Color-Tunable/Dimmable Organic EL Lighting VELVE™ will be Launched!," Apr. 12, 2011, http://www.mcmedia.co.jp/corporate/news/information/release_2011/2011_002.html, with English translation.

"Velve OLED Technology," 2011, http://www.verbatimlighting.eu/en_1/led-article-velve-oled-tecnology_6280.html.

\* cited by examiner

*Primary Examiner* — Don Le

(74) *Attorney, Agent, or Firm* — Husch Blackwell LLP

(57) ABSTRACT

A lighting device using an electroluminescent material, in which color mixing and dimming can be performed by a simple method, is provided. A lighting device including a first light-emitting element and a second light-emitting element which emits light having a wavelength longer than that of light emitted from the first light-emitting element and starts to emit light at a lower voltage than the first light-emitting element, is provided. The first light-emitting element and the second light-emitting element are connected in parallel, whereby a mixed color of emission colors of the first light-emitting element and the second light-emitting element is controlled by a voltage applied to the first light-emitting element and the second light-emitting element.

20 Claims, 11 Drawing Sheets

LIGHTING DEVICE

BACKGROUND OF THE INVENTION

1. Field of the Invention

The present invention relates to a lighting device including a light-emitting member which exhibits electroluminescence.

2. Description of the Related Art

As a next-generation lighting device, a lighting device including a light-emitting element that uses an electroluminescent material has attracted attention because it is estimated to have higher emission efficiency than light bulbs or fluorescent bulbs. A thin film of an electroluminescent material can be formed to a thickness of 1 mm or less by an evaporation method or a coating method, and the structure of such a lighting device has been devised.

The light-emitting element can optionally adjust an emission color by selecting a material to be used as appropriate. For example, Patent Document 1 discloses a lighting device in which a color temperature is adjusted by applying a particular voltage to respective light-emitting elements depending on emission colors of a plurality of respective light-emitting elements.

REFERENCE

Patent Document

[Patent Document 1] Japanese Published Patent Application No. 2005-317296

SUMMARY OF THE INVENTION

An object of one embodiment of the present invention is to provide a lighting device in which color mixing and dimming can be performed by a simple method.

One embodiment of the present invention is a lighting device in which a first light-emitting element and a second light-emitting element with different emission colors and different emission start voltages are connected in parallel and an emission color is controlled by a voltage applied to the first light-emitting element and the second light-emitting element. Specifically, the following structure can be employed for example.

A lighting device of one embodiment of the present invention includes a first light-emitting element, and a second light-emitting element connected in parallel to the first light-emitting element. In the lighting device, the second light-emitting element emits light having a wavelength longer than that of light emitted from the first light-emitting element and starts to emit light at a lower voltage than the first light-emitting element, and a mixed color of emission colors of the first light-emitting element and the second light-emitting element is controlled by a voltage applied to the first light-emitting element and the second light-emitting element.

Further, a lighting device of one embodiment of the present invention includes a first light-emitting element, and a second light-emitting element connected in parallel to the first light-emitting element. In the lighting device, the second light-emitting element emits light having a wavelength longer than that of light emitted from the first light-emitting element and starts to emit light at a lower voltage than the first light-emitting element, the second light-emitting element emits light with higher luminance than light emitted from the first light-emitting element, and a mixed color of emission colors of the first light-emitting element and the second light-emitting element is controlled by a voltage applied to the first light-emitting element and the second light-emitting element.

In the above lighting device, the first light-emitting element and the second light-emitting element may be stacked.

In the above lighting device, the emission color of the first light-emitting element and the emission color of the second light-emitting element are preferably in a relation of complementary colors.

In the above lighting device, the first light-emitting element may have an emission spectrum peak in greater than or equal to 450 nm and less than or equal to 510 nm, and the second light-emitting element may have an emission spectrum peak in greater than or equal to 550 nm and less than or equal to 600 nm.

Note that in this specification and the like, time when a light-emitting element starts to emit light at luminance of 1 $cd/m^2$ is referred to as a light emission start, and a voltage applied at the time is referred to as a light emission start voltage.

In a lighting device of one embodiment of the present invention, color mixing and dimming can be performed by a simple method. Further, in a lighting device of one embodiment of the present invention, one light source can emit light with different color tones; thus, the lighting device can be applied to various uses.

DETAILED DESCRIPTION OF THE INVENTION

Figure 1A:
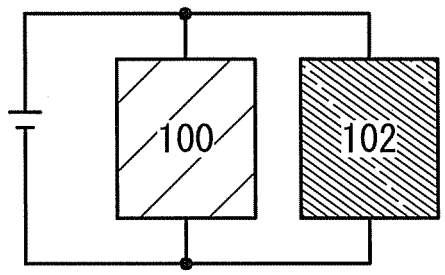
FIGS. 1A to 1C are a conceptual diagram and structural examples of a lighting device according to one embodiment of the present invention.

Hereinafter, embodiments of the present invention will be described with reference to the drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of the embodiments and example below. Note that in the following embodiments and example, like portions or portions having like functions in different drawings are denoted by the like reference numerals and repeated description thereof is omitted.

Note that the position, size, range, or the like of each component illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not limit the components numerically.

(Embodiment 1)

In Embodiment 1, one embodiment of a lighting device is described with reference to FIGS. 1A to 1C, FIGS. 2A and 2B, FIGS. 3A to 3C, FIGS. 4A and 4B, and FIGS. 5A and 5B.

FIG. 1A illustrates a conceptual diagram of a lighting device. The lighting device of one embodiment of the present invention includes a first light-emitting element 100 and a second light-emitting element 102 which are connected in parallel. The first light-emitting element 100 and the second light-emitting element 102 exhibit different emission colors and have different light emission start voltages (light-emission threshold voltages). An example of a case where the second light-emitting element 102 emits light having a wavelength longer than that of light emitted from the first light-emitting element 100 and starts to emit light at a lower voltage than the first light-emitting element 100 is explained. However, an embodiment of the disclosed invention is not limited thereto, and the first light-emitting element 100 may emit light having a wavelength longer than that of light emitted from the second light-emitting element 102 and start to emit light at a lower voltage than the second light-emitting element 102.

The first light-emitting element 100 and the second light-emitting element 102 are connected in parallel; thus, the same voltage is applied thereto. Here, the light emission start voltage of the first light-emitting element 100 (referred to as $Vth_{\_100}$) is higher than the light emission start voltage of the second light-emitting element 102 (referred to as $Vth_{\_102}$); thus, only the light emitted from the second light-emitting element 102 is obtained in the case where a voltage to be applied is greater than or equal to $Vth_{\_102}$ and less than $Vth_{\_100}$. Accordingly, emission colors of the lighting device and the second light-emitting element 102 are the same.

Further, in the case where a voltage to be applied is greater than or equal to $Vth_{\_100}$, light emitted from the second light-emitting element 102 and the first light-emitting element 100 is obtained, and the proportion of the light emitted from the first light-emitting element 100 to the total luminous flux is increased as the voltage to be applied is increased until the intensity of the light emitted from the first light-emitting element 100 is adequately increased (e.g., until the luminous exitance of the first light-emitting element 100 reaches 30000 lm/m²). For example, a voltage at the time the luminous exitance of the first light-emitting element 100 reaches 30000 lm/m² is referred to as $Vf_{\_100}$. In the case where a voltage to be applied is greater than or equal to $Vth_{\_100}$ and less than $Vf_{\_100}$, the emission color of the lighting device is gradually changed from the emission color of the second light-emitting element 102 to a mixed color of the emission colors of the first light-emitting element 100 and the second light-emitting element 102 as the voltage is increased. Further, as the voltage is increased, luminance of the first light-emitting element 100 and the second, light-emitting element 102 is increased, so that luminance of the whole lighting device is also increased.

Furthermore, in the case where the voltage to be applied is greater than or equal to $Vf_{\_100}$, the emission intensity of the whole lighting device is increased as the increase of voltage while the emission color of the lighting device remains unchanged from a mixed color of the emission colors of the first light-emitting element 100 and the second light-emitting element 102.

The light-emitting elements having different emission colors and light emission start voltages are connected in parallel in this manner, whereby color mixing and dimming of the lighting device can be performed only by controlling the voltage to be applied without any additional means. The color mixing and dimming of the lighting device can be performed by a simple method; thus, convenience of the lighting device can be improved.

Note that the emission color of the first light-emitting element 100 and the emission color of the second light-emitting element 102 are preferably in a relation of complementary colors. For example, when the first light-emitting element 100 is an element which exhibits blue to blue-green light emission (light emission having an emission spectrum peak in greater than or equal to 450 nm and less than or equal to 510 nm), and the second light-emitting element 102 is an element which exhibits yellow to orange light emission (light emission having an emission spectrum peak in greater than or equal to 550 nm and less than or equal to 600 nm), the lighting device emits orange light in the case where the voltage of less than the light emission start voltage of the first light-emitting element 100 is applied, and the emission color of the lighting device can be changed to light bulb color, warm white, white, or daylight white as the voltage to be applied is increased.

Note that in the case where the first light-emitting element 100 has approximately the same area as the second light-emitting element 102, when luminous exitance of the second light-emitting element 102 is greater than or equal to 30000 lm/m² at the time the first light-emitting element 100 starts to emit light (that is, $Vth_{\_100}$ is applied to the first light-emitting element 100 and the second light-emitting element 102), the emission color of the whole lighting device is hardly changed even in the case where a voltage to be applied is greater than or equal to $Vth_{\_100}$ and less than $Vf_{\_100}$ because the proportion of the light emitted from the first light-emitting 100 to the total luminous flux is small. Similarly, when luminous exitance of the second light-emitting element 102 is less than 300 lm/m² at the time $Vth_{\_100}$ is applied to the light-emitting element 100 and the second light-emitting element 102, the proportion of the light emitted from the second light-emitting element 102 to the total luminous flux is small, so that the emission color of the lighting device is hard to be modulated. Thus, in the case where the first light-emitting element 100 has approximately the same area as the second light-emitting element 102, luminous exitance of the second light-emitting element 102 is preferably greater than or equal to 300 lm/m² and less than 30000 lm/m² at the time $Vth_{\_100}$ is applied to the first light-emitting element 100 and the second light-emitting element 102. Note that luminous exitance of greater than or equal to 300 lm/m² and less than 30000 lm/m² corresponds to luminance of greater than or equal to 10 cd/m² and less than 10000 cd/m² in a surface light source given perfectly diffusing surface.

Further, the second light-emitting element 102 preferably emits light with higher luminance than the first light-emitting element 100. The second light-emitting element 102 emits light having a wavelength longer than that of light emitted from the first light-emitting element 100; thus, luminosity of the light emitted from the second light-emitting element 102 is higher than that of the light emitted from the first light-emitting element 100. Accordingly, when the second light-emitting element 102 emits light with high luminance, the wavelength range of high luminosity can be utilized effectively and power efficiency can be improved.

As a light-emitting element applicable to a lighting device, an element utilizing an electroluminescence (EL) effect in a principle of light emission can be used. Specifically, a light emitting diode (LED), an element exhibiting organic EL emission (an organic EL element), an element exhibiting inorganic EL emission (an inorganic EL element), or the like can be used. However, the organic EL element has gradual diode characteristics and thus voltage varies from a light emission start point to a point where adequate luminous flux is achieved compared to LED. Thus, it is preferable because the range of voltage in which dimming of the lighting device can be performed can be widen. Further, because the organic EL element generates less heat than LED, an organic resin which is lightweight but is weak to heat can be used as a housing of the lighting device, so that reduction in weight can be achieved.

Figure 1B:
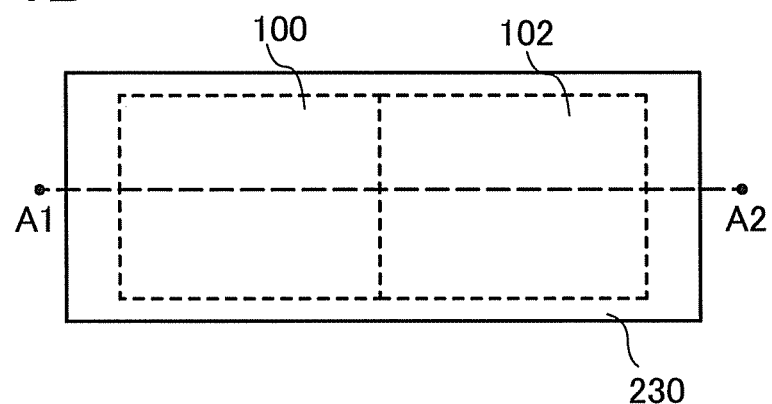
Figure 1C:
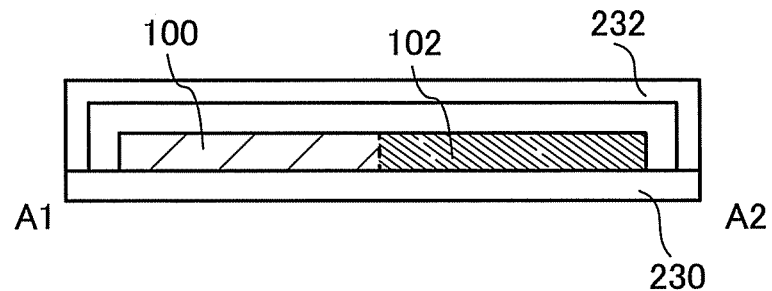

FIGS. 1B and 1C illustrate structural examples of the lighting device. FIG. 1B is a plan view of the lighting device and FIG. 1C is a cross-sectional view taken along line A1-A2 of FIG. 1B. The lighting device illustrated in FIGS. 1B and 1C has the first light-emitting element 100 and the second light-emitting element 102 arranged in a space sealed with a first housing 230 and a second housing 232. Further, the light emission surfaces of the first light-emitting element 100 and the second light-emitting element 102 are arranged on the same surface.

The first light-emitting element 100 and the second light-emitting element 102 includes a pair of electrodes and an EL layer arranged between the pair of electrodes. Light from the EL layer passes through the first housing 230, and is emitted to the outside. Accordingly, the first housing 230 has a property of transmitting light at least from the first light-emitting element 100 and the second light-emitting element 102.

The shape of the emission surface of the first light-emitting element 100 or the second light-emitting element 102 may be a polygon such as a quadrangle or a circle, and the shape of the housing (the first housing 230) covering the emission surface may correspond to the shape of the emission surface.

In FIGS. 1B and 1C, the first housing 230 also functions as a support member of the first light-emitting element 100 and the second light-emitting element 102. Note that the first light-emitting element 100 or the second light-emitting element 102 may be formed over another support member which differs from the first housing 230, and the support member may be arranged over the first housing 230. Alternatively, the first light-emitting element 100 and the second light-emitting element 102 may be formed over the same support member or different support members.

As a specific example of a member used for the first housing 230, plastic (organic resin), glass, quartz, or the like can be given. As an example of plastic, a member made from polycarbonate, polyarylate, polyethersulfone, or the like can be given. It is preferable to use plastic for the first housing 230, because reduction in weight of the lighting device can be achieved.

The second housing 232 can be formed using a member similar to that of the first housing 230. As the second housing 232, plastic is preferably used for reduction in weight. Note that a member formed of a metal material (hereinafter referred to as, a metal member) can be used as the second housing 232 because the second housing 232 does not necessarily have a light-transmitting property. A material of the metal member is not limited to a particular material, but it is preferable to use a metal such as aluminum, copper, or nickel, or an alloy such as an aluminum alloy or stainless steel. There is no particular limitation on the thickness of the metal member; however, the metal member with a thickness of greater than or equal to 10 μm and less than or equal to 200 μm is preferably used because reduction in weight of the lighting device can be achieved. The use of the metal member as the second housing 232 can prevent moisture from entering the first light-emitting element 100 and the second light-emitting element 102 because the metal member has low water permeability. Accordingly, a highly reliable light-emitting device in which deterioration due to moisture is suppressed can be obtained.

The first housing 230 and the second housing 232 are bonded to each other using an adhesive layer (not shown). As the adhesive layer, a visible light curable adhesive, an ultraviolet curable adhesive, or a thermosetting adhesive can be used. As examples of materials of such adhesives, an epoxy resin, an acrylic resin, a silicone resin, a phenol resin, and the like can be given. In addition, a moisture-absorbing substance serving as a drying agent may be contained in such adhesives. It is preferable to use the same organic resin material for the first housing 230, the adhesive layer, and the second housing 232 because adhesion between the first housing 230 and the second housing 232 can be improved. However, the adhesive layer is not necessarily provided, for example, a thermoplastic organic resin may be used as the first housing 230 and the second housing 232, and the first housing 230 and the second housing 232 may be bonded to each other by thermocompression bonding.

The size of the first housing 230 and the second housing 232 can be set as appropriate depending on the usage of the lighting device. For example, a circular shape having a diameter of 10 cm to 14 cm, preferably 12 cm, a square having 5 inches on each side, or the like may be used.

A moisture-absorbing substance serving as a drying agent may be provided in a space between the housings where the first light-emitting element 100 and the second light-emitting element 102 are provided. The moisture-absorbing substance may be arranged as a solid such as a powdery substance or may be arranged as a film containing a moisture-absorbing substance by a film formation method such as a sputtering method. Alternatively, the space between the housings may be sealed with a resin such as an epoxy resin, an acrylic resin, a silicone resin, and a phenol resin.

In addition, an inorganic insulating film covering the top surface of the first light-emitting element 100 and the second light-emitting element 102 and an inner wall of the housings may be provided. The inorganic insulating film serves as a sealing film or a protective layer which blocks an external contaminant such as water. By providing the inorganic insulating film, degradation of the light-emitting element can be reduced and the durability and the lifetime of the lighting device can be improved.

As the inorganic insulating film, a single layer or a stacked layer of, a nitride film and a nitride oxide film can be used. Specifically, the inorganic insulating film can be formed with the use of silicon oxide, silicon nitride, silicon oxynitride, aluminum oxide, aluminum nitride, aluminum oxynitride, or the like by a CVD method, a sputtering method, or the like in accordance with the material. The inorganic insulating film is preferably formed with the use of silicon nitride by a CVD method. The thickness of the inorganic insulating films may be approximately 100 nm to 1 μm. Alternatively, as the inorganic insulating film, an aluminum oxide film, a diamond like carbon (DLC) film, a carbon, film containing nitrogen, a film containing zinc sulfide and silicon oxide (e.g., a ZnS.SiO$_2$ film), or the like may be used.

In the lighting device illustrated in FIGS. 1B and 1C, the light emission surfaces of the first light-emitting element 100 and the second light-emitting element 102 are arranged on the same surface. Thus, a decrease in efficiency due to a stack of light-emitting elements can be suppressed. Note that roughening of the light emission surface of the first housing 230, application of a light-scattering agent to the light emission surface of the first housing 230, arrangement of an optical film such as a diffusion film in the emission surface of the first housing 230, or the like may be performed so as to improve light extraction efficiency. Alternatively, light extraction efficiency can also be improved by provision of a diffraction grating on the light emission surface of the first housing 230. In particular, the above method is effective in the case where the light emission surfaces of the first light-emitting element 100 and the second light-emitting element 102 are arranged on the same surface because the diffraction grating can be designed in accordance with a wavelength of light of each light-emitting element.

Figure 2A:
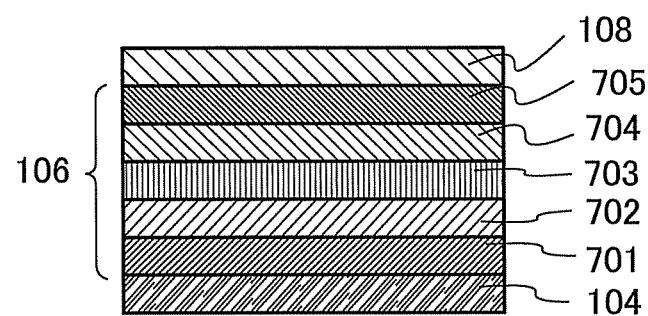
FIGS. 2A and 2B each illustrate a light-emitting element applicable to a lighting device according to one embodiment of the present invention.
Figure 2B:
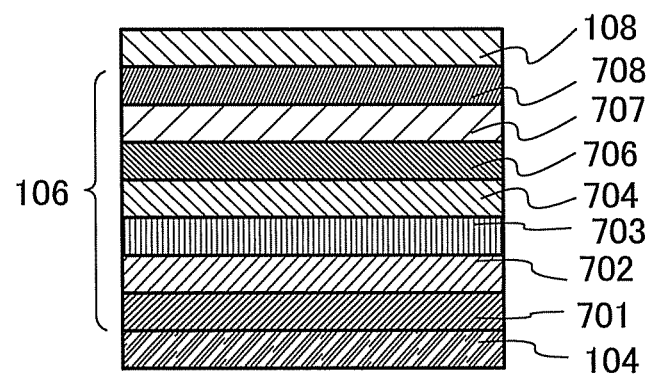

FIGS. 2A and 2B illustrate specific structural examples of the first light-emitting element 100 and the second light-emitting element 102. The light-emitting element illustrated in FIG. 2A includes a first electrode 104, an EL layer 106 over the first electrode 104, and a second electrode 108 over the EL layer 106.

The first electrode 104 is arranged so as to be in contact with the first housing 230 and provided in the direction in which light is extracted from the EL layer 106. Thus the first electrode 104 is formed using a material having a light-transmitting property. As the material having a light-transmitting property, indium oxide, indium tin oxide (also referred to as ITO), indium zinc oxide (also referred to as IZO), zinc oxide, zinc oxide to which gallium is added, graphene, or the like can be used.

In addition, as the first electrode 104, a metal material such as gold, platinum, nickel, tungsten, chromium, molybdenum, iron, cobalt, copper, palladium, or titanium can be used. Further, a nitride of the metal material (such as titanium nitride) or the like may be used. In the case of using the metal material (or the nitride thereof), the first electrode 104 may be thinned so as to be able to transmit light.

The EL layer 106 is provided over the first electrode 104. The EL layer 106 includes at least a light-emitting layer containing a light-emitting organic compound. In addition, the EL layer 106 can have a stacked-layer structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate. In this embodiment, a hole-injection layer 701, a hole-transport layer 702, a light-emitting layer 703, an electron-transport layer 704, and an electron-injection layer 705 are stacked in this order from the first electrode 104 side in the EL layer 106.

The hole-injection layer 701 is a layer containing a substance having a high hole-injection property. Examples of a substance having a high hole-injection property which can be used are metal oxides, such as molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide. Other examples of a substance that can be used are phthalocyanine-based compounds, such as phthalocyanine (abbreviation: $H_2Pc$) and copper(II) phthalocyanine (abbreviation: CuPc).

Other examples of a substance that can be used are aromatic amine compounds which are low molecular organic compounds, such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Still other examples of a substance that can be used are high molecular compounds (e.g., oligomers, dendrimers, and polymers), such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenye-N,N'-bis(phenyl)benzidine] (abbreviation: Poly-TPD), and high molecular compounds to which acid is added, such as poly(3,4-ethylenedioxythiophene)/poly(styrenesulfonic acid) (PEDOT/PSS), or polyaniline/poly(styrenesulfonic acid) (PAni/PSS).

In particular, for the hole-injection layer 701, a composite material in which an acceptor substance is mixed with an organic compound having a high hole-transport property is preferably used. Note that by the use of the composite material in which an acceptor substance is added to a substance having a high hole-transport property, hole injection from the first electrode 104 is facilitated, which leads to a reduction in the drive voltage of the light-emitting element. Such a composite material can be formed by co-depositing a substance having a high hole-transport property and an acceptor substance. The hole-injection layer 701 is formed using the composite material, whereby hole injection from the first electrode 104 to the EL layer 106 is facilitated.

As the organic compound for the composite material, various compounds such as an aromatic amine compound, carbazole derivatives, aromatic hydrocarbon, and a high molecular compound (such as oligomer, dendrimer, or polymer) can be used. The organic compound used for the composite material is preferably an organic compound having a high hole-transport property. Specifically, a substance having a hole mobility of $10^{-6}$ cm$^2$/Vs or higher is preferably used. Note that other than these substances, any substance that has a property of transporting more holes than electrons may be used. The organic compounds which can be used for the composite material is specifically shown below.

Examples of the organic compounds that can be used for the composite material include: aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), and N,N'-bis(3-methylphenyl)-N,N'-diphenyl-[1,1'-biphenyl]-4,4'-diamine (abbreviation: TPD) 4-phenyl-4'-(9-phenylfluoren-9-yl)triphenylamine (abbreviation: BPAFLP); and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10- phenyl-9-anthryl)phenyl]-9H-carbazole (abbreviation: PCzPA), and 1,4-bis[4-(N-carbazolyl)phenyl-2,3,5,6-tetraphenylbenzene.

Other examples of an organic compound that can be used are aromatic hydrocarbon compounds, such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, and 2,3,6,7-tetramethyl-9,10-di(1-naphthyl)anthracene.

Other examples of an organic compound that can be used are aromatic hydrocarbon compounds, such as 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), and 9,10-bis[4-(2,2-diphenylvinyl)phenyl]anthracene (abbreviation: DPVPA).

Further, examples of the electron acceptor are organic compounds, such as 7,7,8,8-tetracyano-2,3,5,6-tetrafluoroquinodimethane (abbreviation: $F_4$-TCNQ) and chloranil, transition metal oxides, and oxides of metals that belong to Groups 4 to 8 in the periodic table. Specific preferred examples include vanadium oxide, niobium oxide, tantalum oxide, chromium oxide, molybdenum oxide, tungsten oxide, manganese oxide, and rhenium oxide because their electron-acceptor properties are high. Among these, molybdenum oxide is especially preferable since it is stable in the air and its hygroscopic property is low and is easily treated.

The composite material may be formed using the above-described electron acceptor and the above-described high molecular compound such as PVK, PVTPA, PTPDMA, or Poly-TPD, and used for the hole-injection layer 701.

The hole-transport layer 702 is a layer that contains a substance having a high hole-transport property. As the substance having a high hole-transport property, any of the following aromatic amine compounds can be used, for example: NPB; TPD; BPAFLP; 4,4'-bis[N-(9,9-dimethylfluoren-2-yl)-N-phenylamino]biphenyl (abbreviation: DFLDPBi); and 4,4'-bis[N-(spiro-9,9'-billuoren-2-yl)-N-phenylamino]biphenyl (abbreviation: BSPB). The substances mentioned here are mainly substances that have a hole mobility of $10^{-6}$ cm$^2$/Vs or higher. Note that other than the above substances, any substance that has a property of transporting more holes than electrons may be used. Further, the layer including a substance having a high hole-transport property is not limited to a single layer, and may be a stack of two or more layers containing any of the above substances.

For the hole-transport layer 702, a carbazole derivative, such as CBP, CzPA, or PCzPA, or an anthracene derivative, such as t-BuDNA, DNA; or DPAnth, may be used.

For the hole-transport layer 702, a high molecular compound such as PVK, PVTPA, PTPDMA, or Poly-TPD, can be used.

The light-emitting layer 703 is a layer containing a light-emitting organic compound. Examples of the light-emitting organic compound include a fluorescent compound which exhibits fluorescence and a phosphorescent compound which exhibits phosphorescence.

The fluorescent compounds that can be used for the light-emitting layer 703 are given below. Examples of the materials that emit blue light include N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(10-phenyl-9-anthryl)-4'-(9-phenyl-9H-carbazol-3-yl)triphenylamine (abbreviation: PCBAPA), and the like. In addition, examples of the materials that emit green light include N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), and the like. Further, examples of the materials that emit yellow light include rubrene, 5,12-bis(1,1'-biphenyl-4-yl)-6,11-diphenyltetracene (abbreviation: BPT), and the like. Furthermore, examples of the materials that emit red light include N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), and the like.

The phosphorescent compounds that can be used for the light-emitting layer 703 are given below. Examples of the materials that emit blue light include bis[2-(4',6'-difluorophenyl)pyridinato-N,$C^{2'}$]iridium(III)tetrakis(1-pyrazolyl)borate (abbreviation: FIr6), bis[2-(4',6'-difluorophenyl)pyridinato-N,$C^{2'}$]iridium(III)picolinate (abbreviation: FIrpic), bis{2-[3',5'-bis(trifluoromethyl)phenyl]pyridinato-N,$C^{2'}$}iridium(III) picolinate (abbreviation: Ir(CF$_3$ ppy)$_2$(pic)), bis[2-(4',6'-difluorophenyppyridinato-N,$C^{2'}$]iridium(III)acetylacetonate (abbreviation: FIr(acac)), and the like. Examples of the materials that emit green light include tris(2-phenylpyridinato-N,$C^{2'}$)iridium(III) (abbreviation: Ir(ppy)$_3$), bis(2-phenylpyridinato-N,$C^{2'}$)iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)fridium(III)acetylacetonate (abbreviation: Ir(bzq)$_2$(acac)), tris(benzo[h]quinolinato)iridium(III) (abbreviation: Ir(bzq)$_3$), and the like. Examples of the materials that emit yellow light include bis(2,4-diphenyl-1,3-oxazolato-N,$C^{2'}$)iridium(III)acetylacetonate (abbreviation: Ir(dpo)$_2$(acac)), bis[2-(4'-(perfluorophenylphenyl)pyridinato]iridium(III)acetylacetonate (abbreviation: Ir(p-PF-ph)$_2$(acac)), bis(2-phenylbenzothiazolato-N,$C^{2'}$)iridium(III) acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), (acetylacetonato)bis{2-(4-methoxyphenyl)-3,5-dimethylpyrazinato}iridium(III) (abbreviation: Ir(dmmoppr)$_2$(acac)), and the like. Examples of the materials that emit orange light include tris(2-phenylquinolinato-N,$C^{2'}$)iridium (III) (abbreviation: Ir(pq)$_3$), bis(2-phenylquinolinato-N,$C^{2'}$)iridium(III)acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), (acetylacetonato)bis(5-isopropyl-3-methyl-2-phenylpyrazinato)iridium (III) (abbreviation: Ir(mppr-iPr)$_2$(acac)), and the like. Examples of the materials that emit red light include organo-metallic complexes such as bis[2-(2'-benzo[4,5-α]thienyl)pyridinato-N,$C^{3'}$)iridium(III)acetylacetonate (abbreviation: Ir(btp)$_2$(acac)), bis(1-phenylisoquinolinato-N,$C^{2'}$)iridium (III)acetylacetonate (abbreviation: Ir(piq)$_2$(acac), (acetylacetonato)bis[2,3-bis(4-fluorophenyl)quinoxalinato]iridium (III) (abbreviation: Ir(Fdpq)$_2$(acac)), (acetylacetonato)bis(2,3,5-triphenylpyrazinato)iridium(III) (abbreviation: Ir(tppr)$_2$ (acac)), (dipivaloylmethanato)bis(2,3,5-triphenylpyrazinato) iridium(III) (abbreviation: Ir(tppr)$_2$(dpm)), and (2,3,7,8,12,13,17,18-octaethyl-21H,23H-porphine)platinum(II) (abbreviation: PtOEP). Any of the following rare earth metal complexes can be used as a phosphorescent compound: tris (acetylacetonato)(monophenanthroline)terbium(III) (abbreviation: Tb(acac)$_3$(Phen)); tris(1,3-diphenyl-1,3-propanedionato)(monophenanthroline)europium(III) (abbreviation: Eu(DBM)$_3$(Phen)); and tris[1-(2-thenoyl)-3,3,3-trifluoroacetonato] (monophenanthroline)europium(III) (abbreviation: Eu(TTA)$_3$(Phen)), because their light emission (generated by electronic transition between different multiplicities) is from a rare earth metal ion.

Note that the light-emitting layer 703 may have a structure in which the above-described light-emitting organic compound (a guest material) is dispersed in another substance (a host material). As a host material, various kinds of materials can be used, and it is preferable to use a substance which has a lowest unoccupied molecular orbital level (LUMO level) higher than the light-emitting substance and has a highest occupied molecular orbital level (HOMO level) lower than that of the light-emitting substance.

Specific examples of the host material are as follows: a metal complex such as tris(8-quinolinolato)aluminum(III) (abbreviation: tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), or bathocuproine (BCP); a condensed aromatic compound such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3"-(benzene-1,3,5-triyl)tripyrene (abbreviation: TPB3), 9,10-diphenylanthracene (abbreviation: DPAnth), or 6,12-dimethoxy-5,11-diphenylchrysene; an aromatic amine compound such as N,N-dipheyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, or BSPB; and the like.

Alternatively, as the host material, plural kinds of materials can be used. For example, in order to suppress crystallization, a substance such as rubrene which suppresses crystallization, may be further added. In addition, NPB, Alq, or the like may be further added in order to efficiently transfer energy to the guest material.

When a structure in which a guest material is dispersed in a host material is employed, crystallization of the light-emitting layer 703 can be suppressed. Further, concentration quenching due to high concentration of the guest material can be suppressed.

For the light-emitting layer 703, a high molecular compound can be used. Specifically, examples of the materials that emit blue light include poly(9,9-dioctylfluorene-2,7-diyl) (abbreviation: PFO), poly[(9,9-dioctylfluorene-2,7-diyl)-co-(2,5-dimethoxybenzene-1,4-diyl)] (abbreviation: PF-DMOP), poly{(9,9-dioctylfluorene-2,7-diyl)-co-[N,N'-di-(p-butylphenyl)-1,4-diaminobenzene]} (abbreviation: TAB-PFH), and the like. Further, examples of the materials that emit green light include poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), poly[(9,9-dioctyl-2,7-divinylenefluorenylene)-alt-co-(2-methoxy-5-(2-ethylhexyloxy)-1,4-phenylene)], and the like. Furthermore, examples of the materials that emit orange to red light include poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenyl amino)-1,4-phenylene]}, poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD), and the like.

Note that the light-emitting layer may have a stacked-layer structure of two or more layers.

In this embodiment, light-emitting elements having different emission colors are used for the first light-emitting element 100 and the second light-emitting element 102. Thus, the light-emitting materials having different emission colors may be selected from the above-described materials as appropriate and used for the light-emitting layers of the first light-emitting element 100 and the second light-emitting element 102.

In the lighting device of this embodiment, a mixed color of the emission colors of the first light-emitting element 100 and the second light-emitting element 102 is controlled to be a desired color by a voltage applied to the first light-emitting element and the second light-emitting element. The emission colors of the first light-emitting element 100 and the second light-emitting element 102 are preferably in a relation of complementary colors because white light emission can be extracted from the lighting device. As the complementary colors, color combinations of blue and yellow, blue-green and red, and the like can be given. For example, an element emitting light in a blue to blue-green wavelength range and an element emitting light in a yellow to orange wavelength range are used as the first light-emitting element 100 and the second light-emitting element 102, respectively, and they are connected in parallel, whereby a lighting device which emits light in an orange to daylight white wavelength range can be obtained.

In addition, since the yellow to orange wavelength range (longer than or equal to 560 nm and shorter than 580 nm) is a wavelength range of high luminosity, it is effective to use an EL layer including a light-emitting layer which has an emission spectrum peak in the yellow to orange wavelength range for the second light-emitting element 102. The wavelength range of high luminosity can be utilized with the use of the EL layer which has an emission spectrum peak in the yellow to orange wavelength range; thus, power efficiency can be improved. Accordingly, power efficiency of the whole light-emitting element can be increased.

For example, an organometallic complex in which a pyrazine derivative serves as a ligand can be used as the light-emitting substance which emits light having a peak in the yellow to orange wavelength range. Alternatively, the light-emitting layers can be fowled by dispersing a light-emitting substance (a guest material) in another substance (a host material). A phosphorescent compound can be used as the light-emitting substance which emits light having a peak in the yellow to orange wavelength range. The power efficiency in the case of using a phosphorescent compound is three to four times as high as that in the case of using a fluorescent compound. The above organometallic complex in which a pyrazine derivative serves as a ligand is a phosphorescent compound, has high emission efficiency, and easily emits light in the yellow to orange wavelength range, and thus is favorable.

For example, a pyrene diamine derivative can be used as the light-emitting substance which emits light having a peak in the blue wavelength range. A fluorescent compound can be used as the light-emitting substance which emits light having a peak in the blue wavelength range. The use of a fluorescent compound makes it possible to obtain a light-emitting element which has a longer lifetime than a light-emitting element in which a phosphorescent compound is used. The above pyrene diamine derivative is a fluorescent compound, can obtain an extremely high quantum yield, and has a long lifetime; thus, the above pyrene diamine derivative is favorable.

The electron-transport layer 704 is a layer that contains a substance having a high electron-transport property. As the substance having a high electron-transport property, any of the following substances can be used, for example: a metal complex having a quinoline skeleton or a benzoquinoline skeleton such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq). Alternatively, a metal complex or the like including an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here mainly have an electron mobility of $10^{-6}$ cm$^2$/Vs or higher. Furthermore, the electron-transport layer is not limited to a single layer, and two or more layers that contain the above-described substances may be stacked.

The electron-injection layer 705 is a layer that contains a substance having a high electron-injection property. For the electron-injection layer 705, an alkali metal, an alkaline-earth metal, or a compound thereof, such as lithium, cesium, calcium, lithium fluoride, cesium fluoride, calcium fluoride, or lithium oxide, can be used. In addition, a rare earth metal compound such as erbium fluoride can also be used. Any of the substances contained in the electron-transport layer 704 which are given above can also be used.

Note that the hole-injection layer 701, the hole-transport layer 702, the light-emitting layer 703, the electron-transport layer 704, and the electron-injection layer 705 which are described above can each be formed by a method such as an evaporation method (e.g., a vacuum evaporation method), an ink-jet method, or a coating method.

As illustrated in FIG. 2B, the EL layer may include the hole-injection layer 701, the hole-transport layer 702, the light-emitting layer 703, the electron-transport layer 704, an electron-injection buffer layer 706, an electron-relay layer 707, and a composite material layer 708 which is in contact with the second electrode 108, between the first electrode 104 and the second electrode 108.

It is preferable to provide the composite material layer 708 which is in contact with the second electrode 108, in which case damage to the EL layer 106 when the second electrode 108 is formed by a sputtering method can be reduced. The composite material layer 708 can be formed using the above-described composite material in which an acceptor substance is mixed with an organic compound having a high hole-transport property.

Further, by providing the electron-injection buffer layer 706, an injection barrier between the composite material layer 708 and the electron-transport layer 704 can be reduced; thus, electrons generated in the composite material layer 708 can be easily injected to the electron-transport layer 704.

A substance having a high electron-injection property can be used for the electron-injection buffer layer 706: for example, an alkali metal, an alkaline earth metal, a rare earth metal, a compound of the above metal (e.g., an alkali metal compound (e.g., an oxide such as lithium oxide, a halide, or carbonate such as lithium carbonate or cesium carbonate), an alkaline earth metal compound (e.g., an oxide, a halide, or carbonate), or a rare earth metal compound (e.g., an oxide, a halide, or carbonate).

Further, in the case where the electron-injection buffer layer 706 contains a substance having a high electron-transport property and a donor substance, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (including an oxide of lithium oxide or the like, a halide, and carbonate such as lithium carbonate or cesium carbonate), an alkaline earth metal compound (including an oxide, a halide, and carbonate), and a rare earth metal compound (including an oxide, a halide, and carbonate). Note that as the substance having a high electron-injection property, a material similar to the material for the electron transport layer 704 described above can be used.

Furthermore, the electron-relay layer 707 is preferably formed between the electron-injection buffer layer 706 and the composite material layer 708. The electron-relay layer 707 is not necessarily provided; however, by providing the electron-relay layer 707 having a high electron-transport property, electrons can be rapidly transported to the electron-injection buffer layer 706.

The structure in which the electron-relay layer 707 is sandwiched between the composite material layer 708 and the electron-injection buffer layer 706 is a structure in which the acceptor substance contained in the composite material layer 708 and the donor substance contained in the electron-injection buffer layer 706 are less likely to interact with each other, and thus their functions hardly interfere with each other. Accordingly, an increase in the driving voltage can be prevented.

The electron-relay layer 707 contains a substance having a high electron-transport property and is formed so that the LUMO level of the substance having a high electron-transport property is located between the LUMO level of the acceptor substance contained in the composite material layer 708 and the LUMO level of the substance having a high electron-transport property contained in the electron-transport layer 704. In the case where the electron-relay layer 707 contains a donor substance, the donor level of the donor substance is controlled so as to be located between the LUMO level of the acceptor substance in the composite material layer 708 and the LUMO level of the substance having a high electron-transport property contained in the electron-transport layer 704. As a specific value of the energy level, the LUMO level of the substance having a high electron-transport property contained in the electron-relay layer 707 is preferably greater than or equal to −5.0 eV, more preferably greater than or equal to −5.0 eV and less than or equal to −3.0 eV.

As the substance having a high electron-transport property contained in the electron-relay layer 707, a phthalocyanine-based material or a metal complex having a metal-oxygen bond and an aromatic ligand is preferably used.

As the phthalocyanine-based material contained in the electron-relay layer 707, in particular, any of the followings is preferably used: CuPc, phthalocyanine tin(II) complex (SnPc), phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc).

As the metal complex having a metal-oxygen bond and an aromatic ligand, which is contained in the electron-relay layer 707, a metal complex having a metal-oxygen double bond is preferably used. The metal-oxygen double bond has acceptor properties (properties of easily accepting electrons); thus, electrons can be transferred (donated and accepted) more easily. Further, the metal complex which has a metal-oxygen double bond is considered stable. Thus, the use of the metal complex having the metal-oxygen double bond enables the light-emitting element to drive at a low voltage more stably.

As a metal complex having a metal-oxygen bond and an aromatic ligand, a phthalocyanine-based material is preferable. Specifically, any of vanadyl phthalocyanine (VOPc), a phthalocyanine tin (IV) oxide complex (SnOPc), and a phthalocyanine titanium oxide complex (TiOPc) is preferable because a metal-oxygen double bond is more likely to act on another molecular in terms of a molecular structure and an acceptor property is high.

Note that as the phthalocyanine-based materials described above, a phthalocyanine-based material having a phenoxy group is preferable. Specifically, a phthalocyanine derivative having a phenoxy group, such as PhO-VOPc, is preferable. The phthalocyanine derivative having a phenoxy group is soluble in a solvent; thus, the phthalocyanine derivative has an advantage of being easily handled during formation of a light-emitting element and an advantage of facilitating maintenance of an apparatus used for deposition.

The electron-relay layer 707 may further contain a donor substance. Examples of the donor substance include an organic compound such as tetrathianaphthacene (abbreviation: TTN), nickelocene, and decamethylnickelocene, in addition to an alkali metal, an alkaline earth metal, a rare earth metal, and a compound of the above metals (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). When such a donor substance is contained in the electron-relay layer 707, electrons can be transferred easily and the light-emitting element can be driven at a lower voltage.

In the case where a donor substance is contained in the electron-relay layer 707, in addition to the materials described above as the substance having a high electron-transport property, a substance having a LUMO level greater than the acceptor level of the acceptor substance contained in the composite material layer 708 can be used. As a specific energy level, a LUMO level is greater than or equal to −5.0 eV, preferably greater than or equal to −5.0 eV and less than or equal to −3.0 eV. As examples of such a substance, a perylene derivative and a nitrogen-containing condensed aromatic compound can be given. Note that a nitrogen-containing condensed aromatic compound is preferably used for the electron-relay layer 707 because of its stability.

As specific examples of the perylene derivative, the following can be given: 3,4,9,10-perylenetetracarboxylicdianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), N,N'-dihexyl-3,4,9,10-perylenetetracarboxylic diimide (Hex PTC), and the like.

As specific examples of the nitrogen-containing condensed aromatic compound, the following can be given: pirazino[2,3-f][1,10]phenanthroline-2,3-dicarbonitrile (PPDN), 2,3,6,7,10,11-hexacyano-1,4,5,8,9,12-hexaazatriphenylene (HAT(CN)$_6$), 2,3-diphenylpyrido[2,3-b]pyrazine (2PYPR), 2,3-bis(4-fluorophenyl)pyrido[2,3-b]pyrazine (F2PYPR), and the like.

Besides, 7,7,8,8-tetracyanoquinodimethane (abbreviation: TCNQ), 1,4,5,8-naphthalenetetracarboxylicdianhydride (abbreviation: NTCDA), perfluoropentacene, copper hexadecafluoro phthalocyanine (abbreviation: F$_{16}$CuPc), N,N'-bis(2,2,3,3,4,4,5,5,6,6,7,7,8,8-pentadecafluorooctyl)-1,4,5,8-naphthalenetetracarboxylic diimide (abbreviation: NTCDI-C8F), 3',4'-dibutyl-5,5"-bis(dicyanomethylene)-5,5"-dihydro-2,2':5',2"-terthiophen (abbreviation: DCMT), a methanofullerene (e.g., [6,6]-phenyl C$_{61}$ butyric acid methyl ester), or the like can be used.

Note that in the case where a donor substance is contained in the electron-relay layer 707, the electron-relay layer 707 may be formed by a method such as co-evaporation of the substance having a high electron-transport property and the donor substance.

The hole-injection layer 701, the hole-transport layer 702, the light-emitting layer 703, and the electron-transport layer 704 may be each formed using any of the above-described materials.

Then, the second electrode 108 is formed over the EL layer 106.

The second electrode 108 is provided on the side opposite to the side from which light is extracted and is formed using a reflective material. As the reflective material, a metal material such as aluminum, gold, platinum, silver, nickel, tungsten, chromium, molybdenum, iron, cobalt, copper, or palladium can be used. Besides, an alloy containing aluminum (an aluminum alloy) such as an alloy of aluminum and titanium, an alloy of aluminum and nickel, or an alloy of aluminum and neodymium, or an alloy containing silver such as an alloy of silver and copper can be used. The alloy of silver and copper is preferable because it has high heat resistance. Further, by stacking a metal film or a metal oxide film in contact with the aluminum alloy film, oxidation of the aluminum alloy film can be suppressed. Examples of a material for the metal film and the metal oxide film include titanium, titanium oxide, and the like. The above materials are preferable because they are present in large amounts in the earth's crust and inexpensive to achieve a reduction in the cost of manufacturing a light-emitting element.

Note that one or both of the first electrode 104 and the second electrode 108 may be used as a common electrode in the first light-emitting element 100 and the second light-emitting element 102 which are arranged in the lighting device.

Further, FIGS. 2A and 2B illustrate a case where the first light-emitting element 100 and the second light-emitting element 102 are organic EL light-emitting elements; however, embodiments of the present invention are not limited thereto, and an LED, an inorganic EL element, or the like can be used as the first or the second light-emitting element. For example, in the case where an LED is used as the first or the second light-emitting element, aluminum gallium arsenide (AlGaAs), gallium arsenide phosphide (GaAsP), indium gallium nitride (InGaN), gallium nitride (GaN), aluminum gallium nitride (AlGaN), gallium phosphide (GaP), zinc selenide (ZnSe), aluminum gallium indium phosphide (AlGaInP), or the like can be used for a material of the EL layer.

Figure 3A:
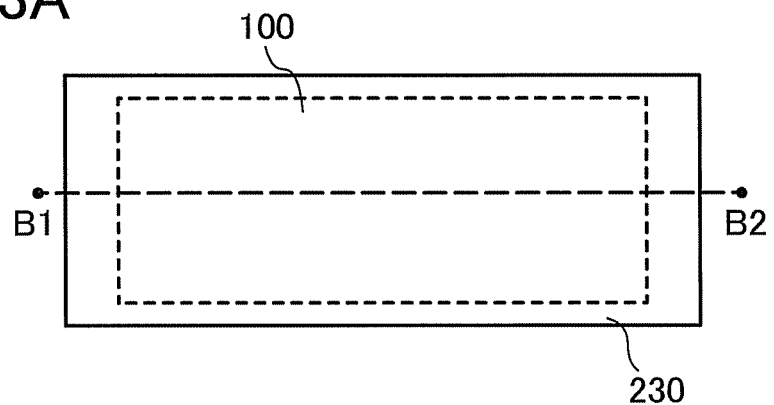
FIGS. 3A to 3C are structural examples of a lighting device according to one embodiment of the present invention.
Figure 3B:
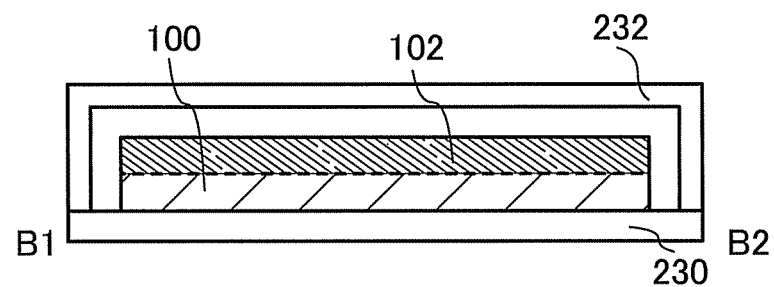

Furthermore, arrangement of the first light-emitting element 100 and the second light-emitting element 102 in the space sealed with the first housing 230 and the second housing 232 is not limited to the structure in FIGS. 1B and 1C. FIGS. 3A and 3B illustrate another example of arrangement of the first light-emitting element 100 and the second light-emitting element 102.

FIG. 3A is a plan view of a lighting device and FIG. 3B is a cross-sectional view taken along line B1-B2 of FIG. 3A. In the lighting device of FIGS. 3A and 3B, the light emission surfaces of the first light-emitting element 100 and the second light-emitting element 102 are arranged to overlap with each other.

The light emission surfaces of the first light-emitting element 100 and the second light-emitting element 102 are arranged to overlap with each other as illustrated in FIGS. 3A and 3B, whereby light emission can be obtained from the whole light emission surfaces without depending on a voltage applied to the first light-emitting element 100 and the second light-emitting element 102. Thus, flicker generated from the lighting device can be prevented and the lighting device in which light-emitting quality is improved can be provided.

In the case where the first light-emitting element 100 and the second light-emitting element 102 are arranged to overlap with each other, the first light-emitting element 100 and the second light-emitting element 102 may be stacked over the same support or different supports.

In the case where the first light-emitting element 100 and the second light-emitting element 102 are stacked over the same support, an insulating layer may be formed over the first light-emitting element 100 after the formation of the first light-emitting element 100, and the second light-emitting element 102 may be formed over the insulating layer. Alternatively, as illustrated in FIG. 3C, one of the electrodes of the first light-emitting element 100 and the second light-emitting element 102 may be a common electrode.

Figure 3C:
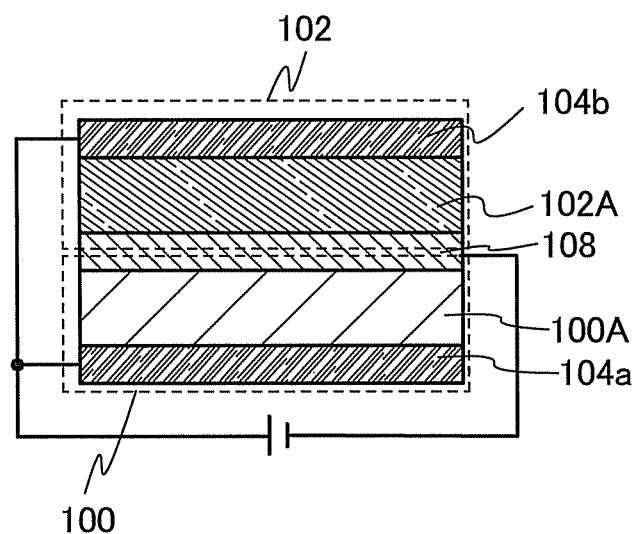

In FIG. 3C, the first light-emitting element 100 includes a first electrode 104a, a first EL layer 100A provided over the first electrode 104a, and a second electrode 108 provided over the first EL layer 100A, and the second light-emitting element 102 includes the second electrode 108 that is a common electrode shared by the first light-emitting element 100, a second EL layer 102A, and a first electrode 104b formed over the second EL layer 102A. In addition, the first light-emitting element 100 and the second light-emitting element 102 are connected in parallel.

With the element structure illustrated in FIG. 3C, power efficiency per unit area of the first light-emitting element 100 and the second light-emitting element 102 can be improved. Further, by stacking the first light-emitting element 100 and the second light-emitting element 102, the amount of current supplied to the EL layer of the light-emitting elements can be reduced. Thus, lifetime of the element can be improved.

Figure 4A:
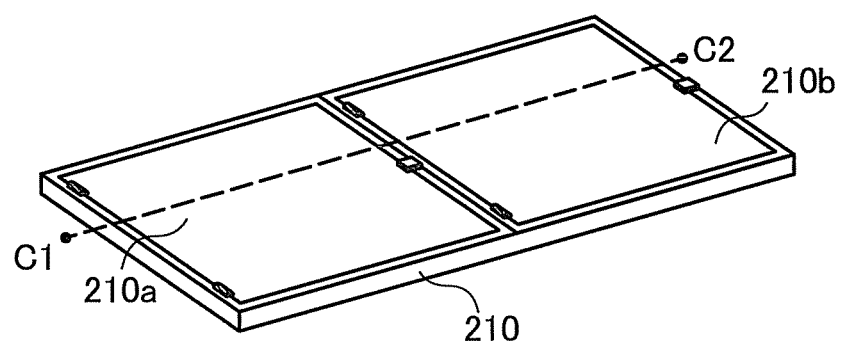
FIGS. 4A and 4B are structural examples of a lighting device according to one embodiment of the present invention.
Figure 4B:
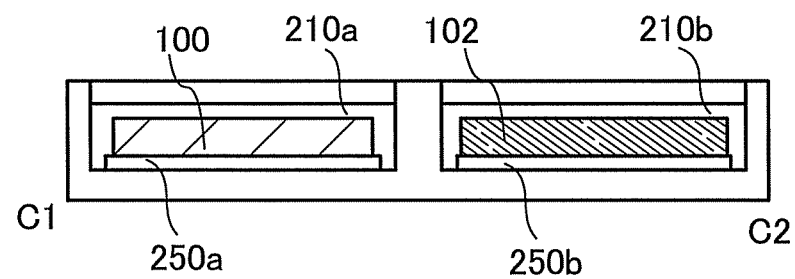

In addition, as illustrated in FIGS. 4A and 4B, the first light-emitting element 100 and the second light-emitting element 102 can be separately held by a holding member 210 including a plurality of enclosed spaces. FIG. 4A is a top view of the lighting device, and FIG. 4B is a cross-sectional view of FIG. 4A taken along a line C1-C2.

The lighting device illustrated in FIGS. 4A and 4B is provided with enclosed spaces 210a and 210b in the holding member 210 of the light-emitting element. The first light-emitting element 100 provided over a support member 250a is arranged in the enclosed space 210a, and the second light-emitting element 102 provided over a support member 250b is arranged in the enclosed space 210b.

As the holding member 210, and the support members 250a and 250b, the same material as that of the first housing 230 can be used.

A moisture-absorbing substance serving as a drying agent may be provided in the enclosed spaces 210a and 210b. Alternatively, an inorganic insulating film may be provided on an inner wall of the enclosed spaces 210a and 210b. Further alternatively, a light-emitting element sealed with a housing or the like may be provided in the enclosed space.

With the structure illustrated in FIGS. 4A and 4B, the first light-emitting element 100 and the second light-emitting element 102 can be exchanged independently in the case where a problem in luminescence properties occurs in the first light-emitting element 100 or the second light-emitting element 102 (e.g. the light-emitting element reached the end of its life), or in the case where an emission color of the lighting device is to be changed to a color which can not be obtained from the first and the second light-emitting elements. Thus, maintenance and management of the lighting device can be performed at low cost.

Figure 5A:
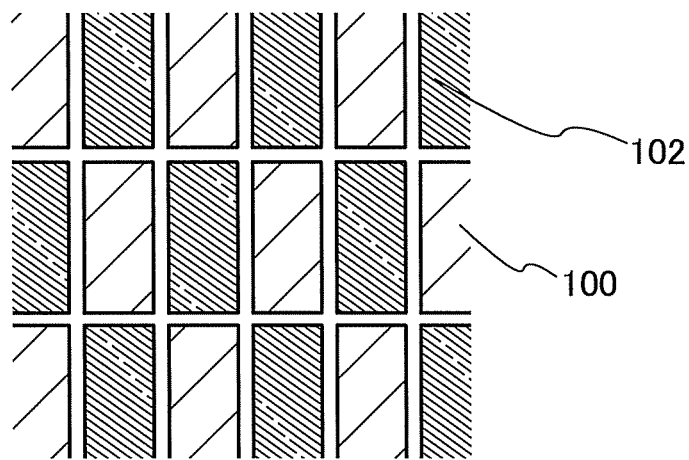
FIGS. 5A and 5B each illustrate an example of arrangement of a light-emitting element.
Figure 5B:
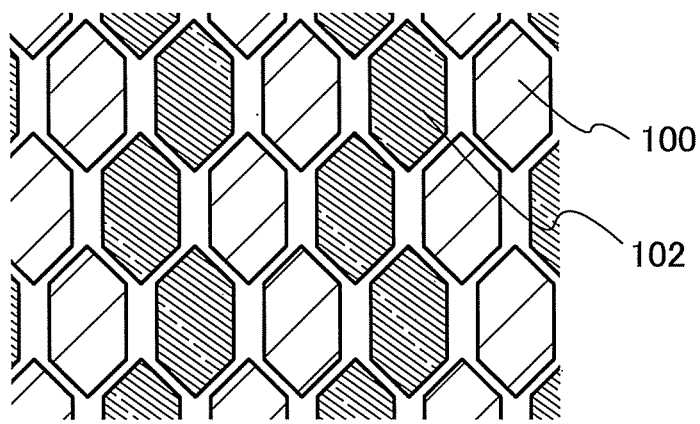

The number and the shape of the light-emitting elements arranged in the lighting device are not limited to those described above, and can be designed as appropriate depending on a usage mode of the lighting device. For example, as illustrated in FIG. 5A, a plurality of first light-emitting elements 100 and second light-emitting elements 102 each of which has a rectangular light-emitting region may be provided alternately. Alternatively, as illustrated in FIG. 5B, a plurality of first light-emitting elements 100 and second light-emitting elements 102 each of which has a hexagonal light-emitting region may be arranged in a so-called honeycomb structure so that density of arrangement of the lighting element is improved.

As described above, in the lighting device of this embodiment, color mixing and dimming of the lighting device can be performed only by controlling a voltage to be applied without any additional means. The color mixing and dimming of the lighting device can be performed by a simple method; thus, convenience of the lighting device can be improved. Further, in the lighting device of one embodiment of the present invention, one light source can emit light with different color tones; thus, the lighting device can be applied to various uses.

This embodiment can be implemented in appropriate combination with the structures described in the other embodiments.

(Embodiment 2)

In this embodiment, application examples of the lighting device of Embodiment 1 is described.

Figure 6:
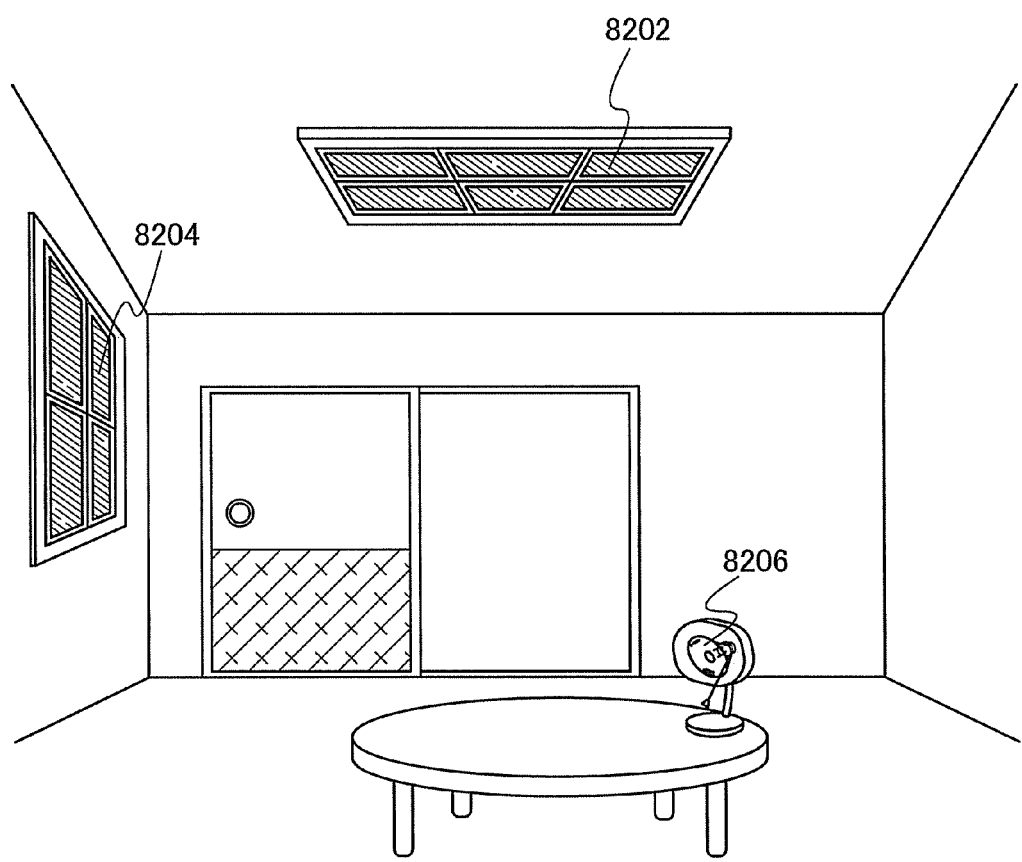
FIG. 6 is an application example of a lighting device.

FIG. 6 illustrates an example in which the lighting device of one embodiment of the present invention is used as an indoor lighting device. The lighting device of one embodiment of the present invention can be used not only as a ceiling-mounted lighting device 8202, but also as a wall-mounted lighting device 8204. The lighting device can also be used as a desk lighting device 8206. Since the lighting device of one embodiment of the present invention has a planar light source, it has advantages such as a reduction in the number of components like a light-reflecting plate as compared with the case of using a point light source, or less heat generation as compared with a filament bulb, and is preferably used as an indoor lighting device.

Next, FIGS. 7A to 7D illustrate examples in which the lighting device of one embodiment of the present invention is applied to a lighting device such as traffic lights or guide lights.

Figure 7A:
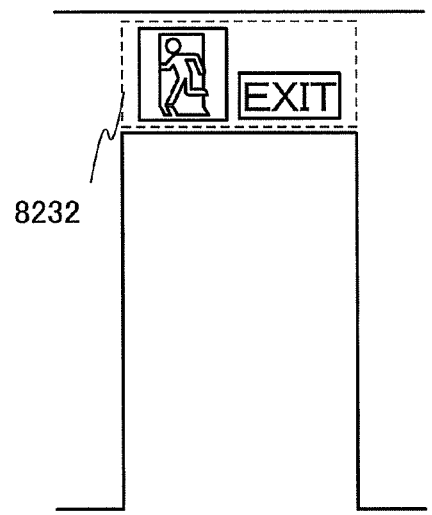
FIGS. 7A to 7D are application examples of a lighting device.

FIG. 7A illustrates an example in which the lighting device of one embodiment of the present invention is applied to an emergency exit light.

For example, FIG. 7A is an external view of an emergency exit light. An emergency exit light 8232 can be formed by combination of a lighting device and a fluorescent plate provided with a fluorescent portion. The emergency exit light 8232 can also be formed by combination of a lighting device emitting a specific light and a light-shielding plate provided with a transmitting portion having a shape illustrated in the drawing. The lighting device that is one embodiment of the present invention can emit light with a constant luminance, and thus is preferably used as an emergency exit light that needs to be on at all times.

Figure 7B:
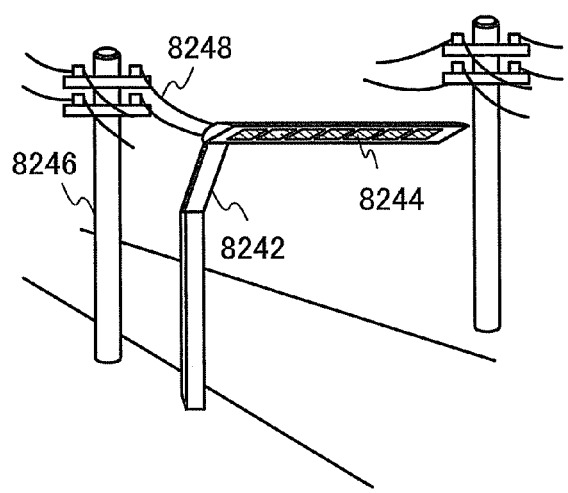

FIG. 7B illustrates an example in which the lighting device of one embodiment of the present invention is applied to an outdoor light.

An example of the outdoor light is a streetlight. A streetlight can be formed by, for example, a housing 8242 and a lighting portion 8244 as illustrated in FIG. 7B. A plurality of lighting devices of one embodiment of the present invention can be arranged in the lighting portion 8244. As illustrated in FIG. 7B, for example, the streetlight stands by the side of a road so that the lighting portion 8244 can illuminate the surroundings, whereby the visibility of the road and its surroundings can be improved.

In the case where a power source voltage is supplied to the streetlight, for example, it can be supplied through a power line 8248 on a utility pole 8246 as illustrated in FIG. 7B. Note that the present invention is not limited to this case; for example, a photoelectric converter may be provided in the housing 8242 so that a voltage obtained from the photoelectric converter can be used as a power source voltage.

Figure 7C:
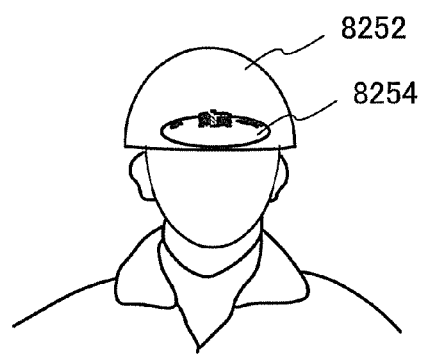
Figure 7D:
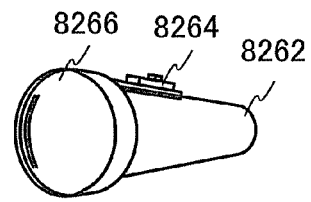

FIGS. 7C and 7D illustrate examples in which the lighting device of one embodiment of the present invention is applied to a portable light. FIG. 7C illustrates a structure of a wearable light and FIG. 7D illustrates a structure of a handheld light.

The wearable light illustrated in FIG. 7C includes a mounting portion 8252 and a lighting portion 8254 fixed to the mounting portion 8252. The lighting device that is one embodiment of the present invention can be used for the lighting portion 8254. In the wearable light illustrated in FIG. 7C, the lighting portion 8254 can emit light while the mounting portion 8252 is attached to the head. When a planar light source is used for the lighting portion 8254, the visibility of the surroundings can be improved. In addition, the lighting portion 8254 is lightweight, which makes it possible to reduce the load on the head on which the light is mounted.

Note that the structure of the wearable light is not limited to that illustrated in FIG. 7C. For example, the mounting portion 8252 may be a belt of flat string or rubber band, the lighting portion 8254 may be fixed to the belt, and the belt may be directly tied around the head.

The handheld light illustrated in FIG. 7D includes a housing 8262, a lighting portion 8266, and a switch 8264. The lighting device that is one embodiment of the present invention can be used for the lighting portion 8266. The use of the lighting device that is one embodiment of the present invention reduces the thickness of the lighting portion 8266 and thus reduces the size of the light, which makes it easy for the light to be carried around.

The switch 8264 has a function of controlling emission or non-emission of the lighting portion 8266. The switch 8264 can also have a function of controlling, for example, the luminance of the lighting portion 8266 during light emission.

In the handheld light illustrated in FIG. 7D, the lighting portion 8266 is turned on with the switch 8264 so as to illuminate the surroundings, whereby the visibility of the surroundings can be improved. Furthermore, since the lighting device that is one embodiment of the present invention has a planar light source, the number of components like a light-reflecting plate can be reduced as compared with the case of using a point light source.

What is described in this embodiment with reference to each drawing can be freely combined with or replaced with what is described in other embodiments as appropriate.

EXAMPLE

In this example, a specific structural example of a light-emitting element which can be applied to a lighting device and the lighting device using the light-emitting element is described with reference to the drawings.

Figure 8A:
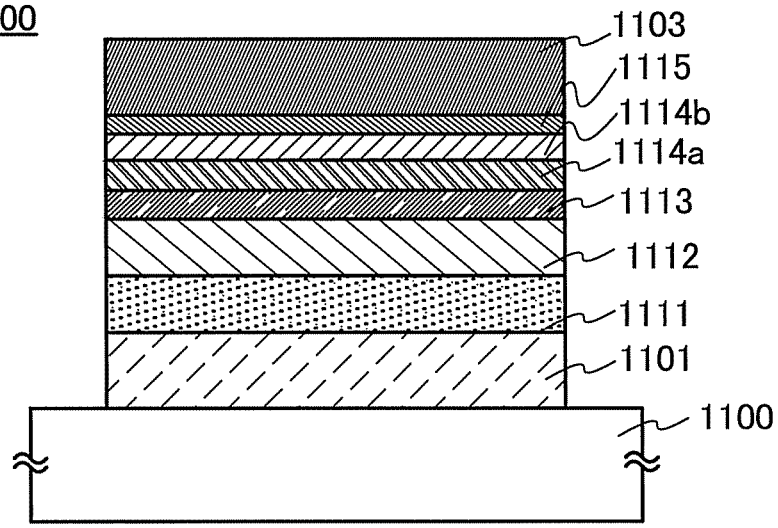
FIGS. 8A and 8B each illustrate a light-emitting element of Example.
Figure 8B:
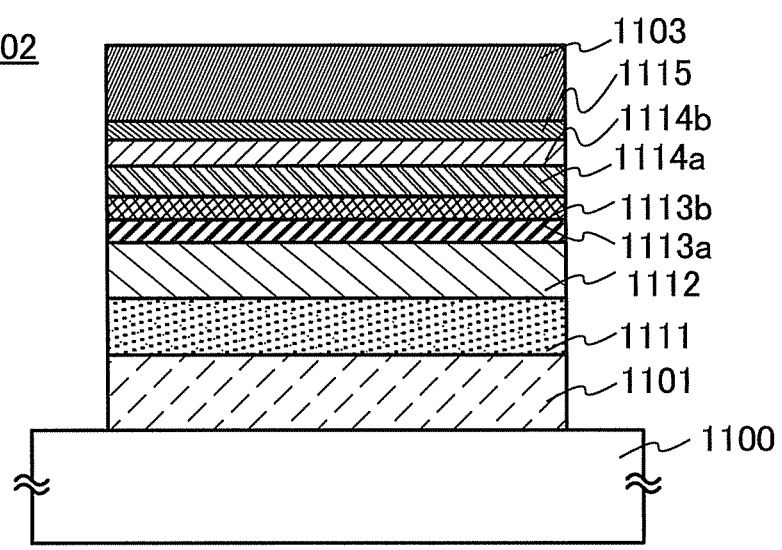

A method for manufacturing a first light-emitting element 200 is described with reference to FIG. 8A. Further, a method for manufacturing a second light-emitting element 202 is described with reference to FIG. 8B. A structural formula of an organic compound used in this example is shown below.

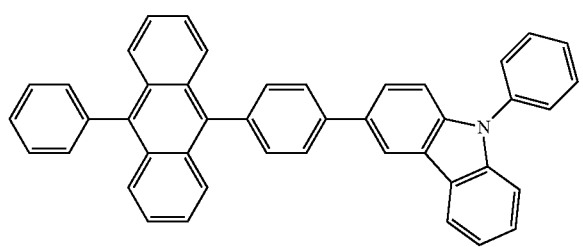

PCzPA

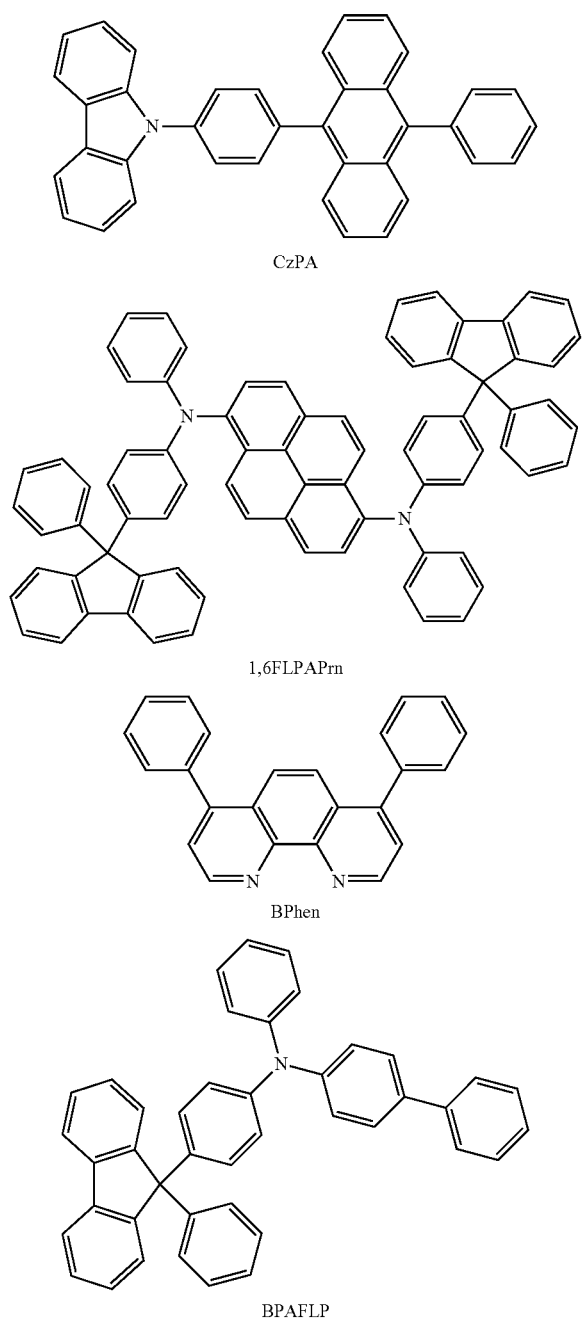
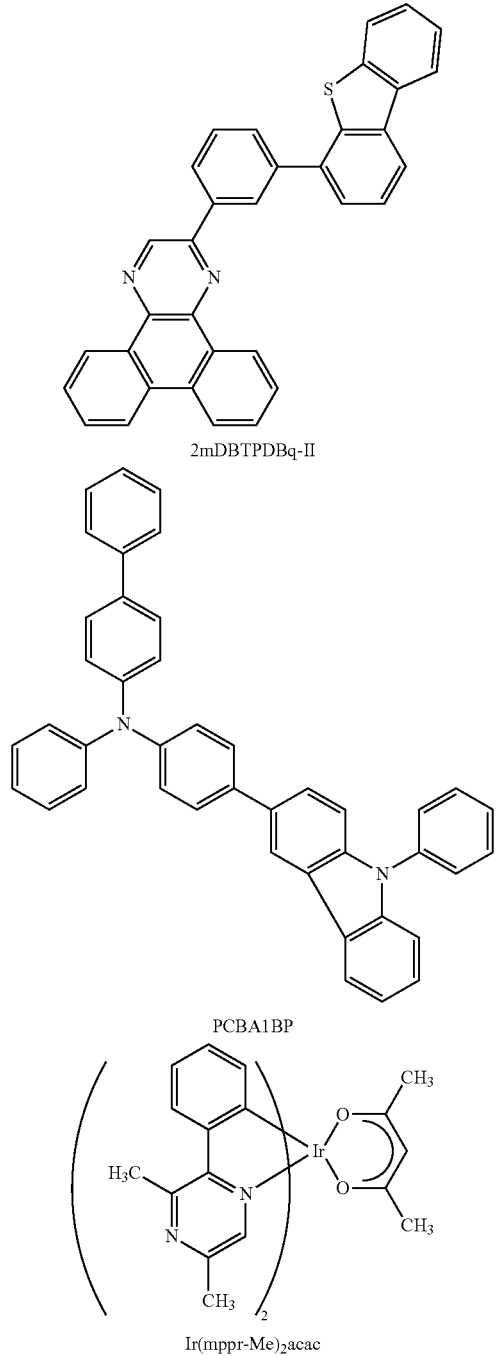

(First Light-Emitting Element 200)

First, indium tin oxide containing silicon oxide (ITSO) was deposited by a sputtering method on a substrate 1100, whereby a first electrode 1101 was formed. The thickness was 110 nm and the electrode area was 2 mm×2 mm. In this example, the first electrode 1101 was used as an anode.

Next, the substrate 1100 provided with the first electrode 1101 was fixed to a substrate holder in a vacuum evaporation apparatus so that a surface on which the first electrode 1101 was provided faced downward. The pressure in the vacuum evaporation apparatus was reduced to about $10^{-4}$ Pa. Then, 9-[4-(9-phenylcarbazol-3-yl)]phenyl-10-phenylanthracene (abbreviation: PCzPA), and molybdenum(VI) oxide were co-evaporated to form a hole-injection layer 1111 on the first electrode 1101. The thickness of the hole-injection layer 1111 was set to 70 nm, and the weight ratio of PCzPA to molybdenum(VI) oxide was adjusted to be 4:2 (=PCzPA:molybdenum oxide). Note that the co-evaporation method refers to an evaporation method in which evaporation is carried out from a plurality of evaporation sources at the same time in one treatment chamber.

Next, a PCzPA film was deposited to a thickness of 30 nm on the hole-injection layer 1111, whereby a hole-transport layer 1112 was formed.

Furthermore, 9-[4-(N-carbazolyl)]phenyl-10-phenylanthracene (abbreviation: CzPA) and N,N'-bis[4-(9-phenyl-9H-fluoren-9-yl)phenyl]-N,N'-diphenylpyrene-1,6-diamine (abbreviation: 1,6FLPAPrn) were co-evaporated to form a light-emitting layer 1113 on the hole-transport layer 1112. Here, the weight ratio of CzPA to 1,6FLPAPrn was adjusted to 1:0.05 (=CzPA:1,6FLPAPrn). The thickness of the light-emitting layer 1113 was set to 20 nm.

Next, a CzPA film was deposited to a thickness of 15 nm on the light-emitting layer 1113, whereby a first electron-transport layer 1114a was formed.

Then, a bathophenanthroline (abbreviation: BPhen) film was deposited to a thickness of 15 nm on the first electron-transport layer 1114a, whereby a second electron-transport layer 1114b was formed.

Further, a lithium fluoride (LiF) film was formed to a thickness of 1 nm on the second electron-transport layer 1114b by evaporation, whereby an electron-injection layer 1115 was formed.

Lastly, aluminum was evaporated to a thickness of 200 nm as a second electrode 1103 functioning as a cathode. Thus, the first light-emitting element 200 was fabricated.

(Second Light-Emitting Element 202)

The first electrode 1101 was formed in a manner similar to that of the first light-emitting element 200.

Next, the substrate 1100 provided with the first electrode 1101 was fixed to a substrate holder in the vacuum evaporation apparatus so that a surface on which the first electrode 1101 was provided faced downward. The pressure in the vacuum evaporation apparatus was reduced to about $10^{-4}$ Pa. Then, PCzPA and molybdenum(VI) oxide were co-evaporated to form a hole-injection layer 1111 over the first electrode 1101. The thickness of the hole-injection layer 1111 was set to 50 nm, and the weight ratio of PCzPA to molybdenum(VI) oxide was adjusted to be 4:2 (=PCzPA: molybdenum oxide).

Next, 4-phenyl-4'-(9-phenylfluoren-9-yl)triphenylamine (abbreviation: BPAFLP) was deposited to a thickness of 20 nm on the hole-injection layer 1111, whereby the hole-transport layer 1112 was formed.

Next, on the hole-transport layer 1112, 2-[3-(dibenzothiophen-4-yl)phenyl]dibenzo[f,h]quinoxaline (abbreviation: 2mDBTPDBq-II), 4-phenyl-4'-(9-phenyl-9H-carbazol-3-yl)triphenylamine (abbreviation: PCBA1BP), and (acetylacetonato)bis(3,5-dimethyl-2-phenylpyrazinato)iridium(III) (abbreviation: Ir(mppr-Me)$_2$(acac)) were co-evaporated, whereby a first light-emitting layer 1113a was formed. Here, the weight ratio of 2mDBTPDBq-II to PCBA1BP and Ir(mppr-Me)$_2$(acac) was adjusted to be 0.6: 0.2:0.06 (=2mDBTPDBq-II: PCBA1BP: Ir(mppr-Me)$_2$(acac)). The thickness of the first light-emitting layer 1113a was set to 15 nm.

Furthermore, 2mDBTPDBq-II and Ir(mppr-Me)$_2$(acac) were co-evaporated, whereby the second light-emitting layer 1113b was formed over the first light-emitting layer 1113a. Here, the weight ratio of 2mDBTPDBq-II to Ir(mppr-Me)$_2$acac was adjusted to be 1:0.06 (=2mDBTPDBq-II: Ir(mppr-Me)$_2$(acac)). The thickness of the second light-emitting layer 1113b was set to 15 nm.

Next, on the second light-emitting layer 1113b, 2mDBT-PDBq-II was deposited to a thickness of 25 nm, whereby the first electron-transport layer 1114a was formed.

Then, the second electron-transport layer 1114b, the electron-injection layer 1115, and the second electrode 1103 were formed in a manner similar to that of the first light-emitting element 200, whereby the second light-emitting element 202 was fabricated.

Note that, in the above evaporation process, evaporation was all performed by a resistance heating method.

In a glove box under a nitrogen atmosphere, the first light-emitting element 200 and the second light-emitting element 202 were sealed so as not to be exposed to the air. After that, the operating characteristics of these elements were measured. Note that the measurement was carried out at room temperature (in an atmosphere kept at 25° C.).

Figure 9A:
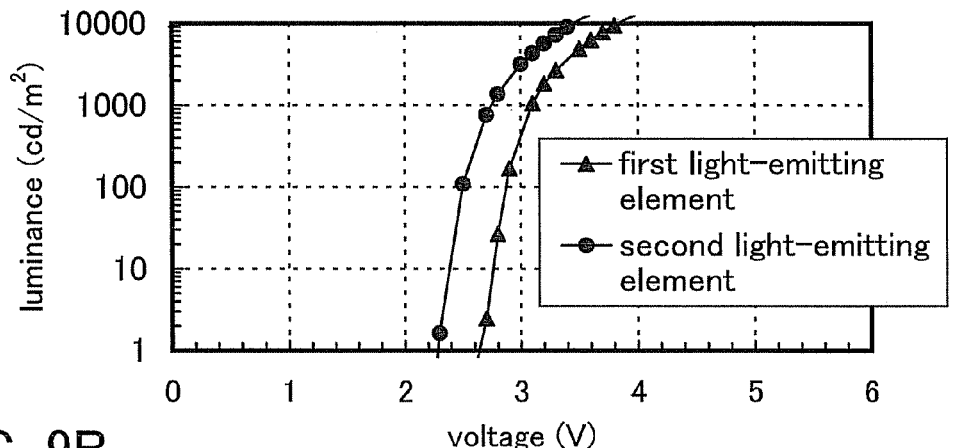
FIGS. 9A to 9C illustrate characteristics of light-emitting elements of Example.
Figure 9B:
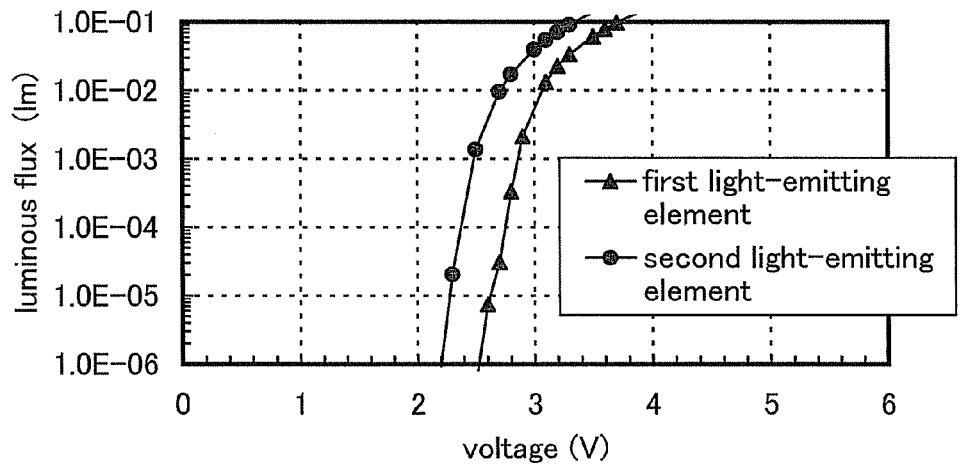
Figure 9C:
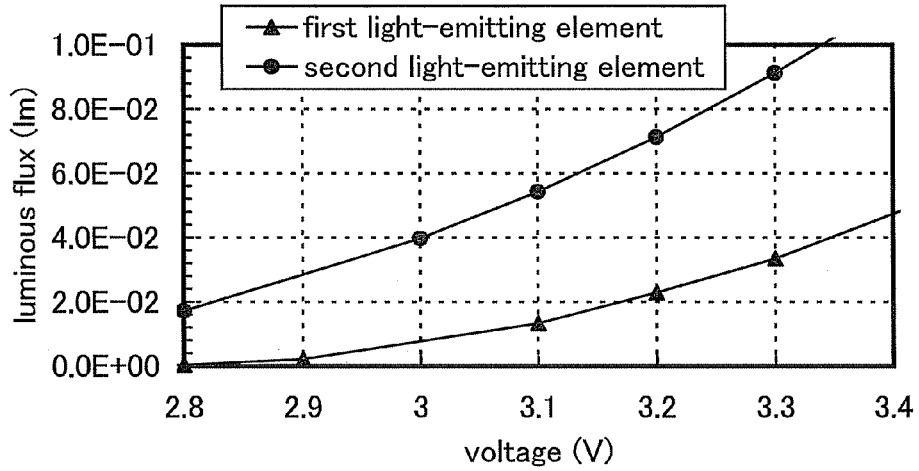

FIG. 9A shows voltage-luminance characteristics of the first light-emitting element 200 and the second light-emitting element 202. In FIG. 9A, the horizontal axis represents voltage (V) and the vertical axis represents luminance (cd/m$^2$). Further, each of FIGS. 9B and 9C shows voltage-luminous flux characteristics of the first light-emitting element 200 and the second light-emitting element 202. FIG. 9C is a chart representing an enlargement of FIG. 9B in the range of 2.8 V to 3.4 V. In each of FIGS. 9B and 9C, the horizontal axis represents voltage (V) and the vertical axis represents luminous flux (lm).

In FIG. 9A, the light emission start voltage of the second light-emitting element 202 is 2.3V, which is lower than a light emission start voltage of the first light-emitting element 200, 2.7V. Accordingly, in the case where the first light-emitting element 200 and the second light-emitting element 202 are connected in parallel, light emission only from the second light-emitting element 202 is obtained when an applied voltage is greater than or equal to 2.3V and less than 2.7V.

Further, as shown in FIGS. 9B and 9C, as the applied voltage is increased, light emitted from the first light-emitting element 200 is obtained. Thus, the proportion of the light emitted from the first light-emitting element 200 to the total luminous flux is increased.

Figure 10:
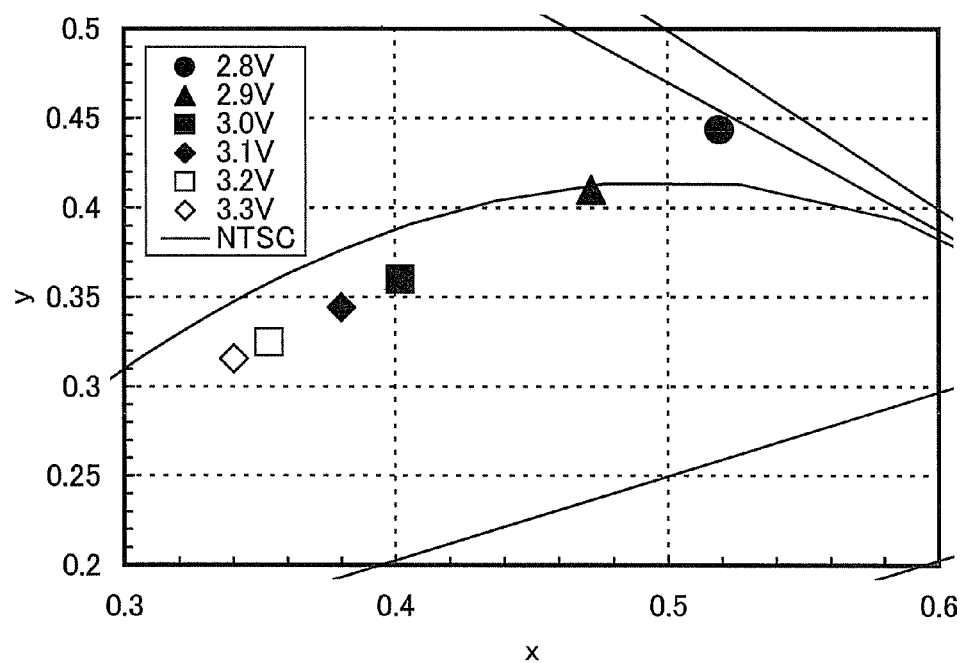
FIG. 10 illustrates a calculation result of characteristics of a lighting device of Example.
Figure 11:
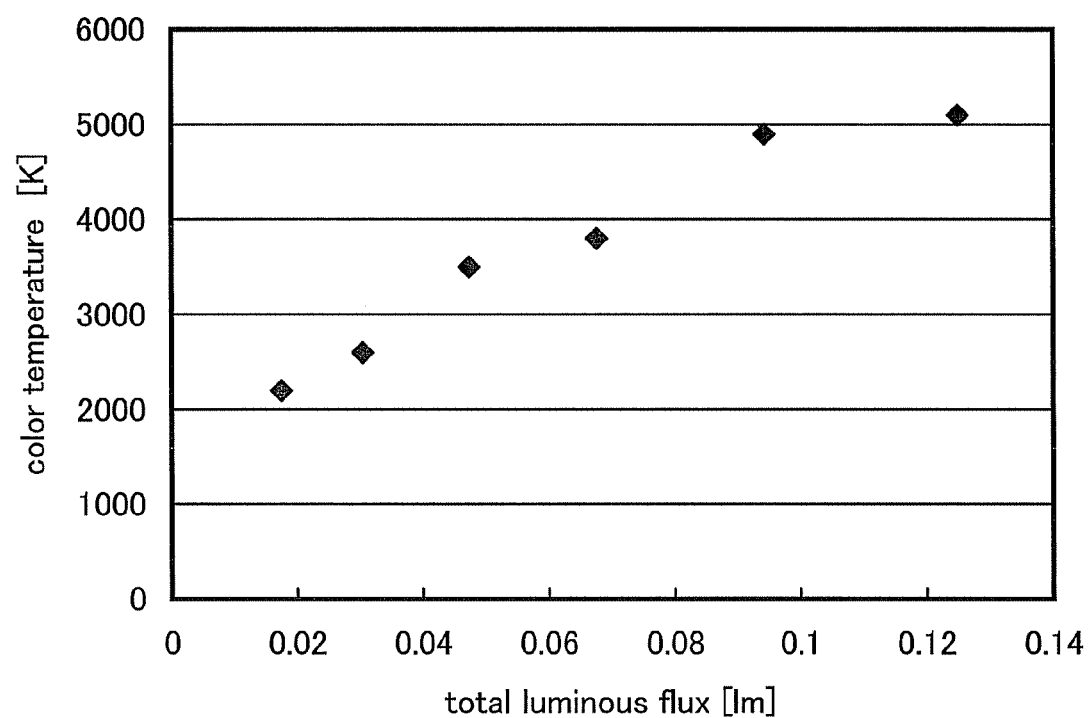
FIG. 11 illustrates a calculation result of characteristics of a lighting device of Example.

The characteristics of the lighting device of this example in which the first light-emitting element 200 and the second light-emitting element 202 are connected in parallel are obtained by calculation. FIG. 10 shows CIE chromaticity coordinates obtained from calculation results of chromatic change due to a difference of the applied voltage. Further, the relation among an applied voltage, an emission color, and the intensity of light emission (luminance and luminous flux) is shown in Table 1. Furthermore, FIG. 11 shows luminous flux-color temperature characteristics of the lighting device of this example. In FIG. 11, the horizontal axis represents the total luminous flux (lm) of the first light-emitting element 200 and the second light-emitting element 202 and the vertical axis represents a color temperature (K).

TABLE 1

| Voltage[V] | Color Temperature [K] | Color | Total Luminance [cd/m$^2$] | Luminous Flux [lm] |
|---|---|---|---|---|
| 2.8 | 2200 | Orange | 1400 | 0.0175 |
| 2.9 | 2600 | ~Bulb color | 2430 | 0.0305 |
| 3.0 | 3500 | Warm white | 3770 | 0.0474 |

TABLE 1-continued

| Voltage[V] | Color Temperature [K] | Color | Total Luminance [cd/m$^2$] | Luminous Flux [lm] |
|---|---|---|---|---|
| 3.1 | 3800 | White | 5380 | 0.0676 |
| 3.2 | 4900 | Daylight White | 7510 | 0.0943 |
| 3.3 | 5100 | Daylight White | 9940 | 0.125 |

In this example, the first light-emitting element 200 emits blue light due to 1,6FLPAPrn, and the second light-emitting element 202 emits orange light due to Ir(mppr-Me)$_2$(acac). When the first light-emitting element 200 and the second light-emitting element 202 which have the same size of area are connected in parallel and an applied voltage is 2.8V, orange light that is an emission color of the second light-emitting element 202 is obtained from the whole lighting device. Further, as the applied voltage is increased, luminous flux of the lighting device is increased, and the proportion of the light emitted from the first light-emitting element 200 to the total luminous flux is increased. Thus, the emission color of the lighting device is changed to warm white, white, and daylight white in order.

Further, when the applied voltage is 3.2V or more, luminous flux of the first light-emitting element 200 is sufficiently increased. Thus, the luminous flux can be increased while daylight white of the emission color of the lighting device is maintained.

As described above, light-emitting elements having different emission colors and different light emission start voltages are connected in parallel in the lighting device of this example, whereby color mixing and dimming of the lighting device can be performed only by controlling a voltage to be applied without any additional means.

Note that in the lighting device of this example, when total luminous flux is low, the lighting device emits light in a warm color tone (orange or bulb color). And as the total luminous is increased (an applied voltage is increased), the lighting device emits light close to white. In this manner, color mixing can be performed. In general, it is said that using warm color lighting at low luminance levels and using white lighting at high luminance levels make people comfortable. Therefore, the lighting device of this example is also effective in the relation between a color tone and brightness.

This application is based on Japanese Patent Application serial no. 2010-259252 filed in Japan Patent Office on Nov. 19, 2010, the entire contents of which are hereby incorporated by reference.

What is claimed is:

1. A lighting device comprising:
a first light-emitting element emitting first light; and
a second light-emitting element connected in parallel to the first light-emitting element, the second light-emitting element emitting second light,
wherein the second light has a longer wavelength than the first light,
wherein the second light-emitting element starts to emit the second light at a lower voltage than the first light-emitting element, and
wherein a mixed color of a color of the first light and a color of the second light is controlled by a voltage applied to the first light-emitting element and the second light-emitting element.

2. The lighting device according to claim 1, wherein the first light-emitting element and the second light-emitting element are stacked.

3. The lighting device according to claim 1, wherein the color of the first light and the color of the second light are in a relation of complementary colors.

4. The lighting device according to claim 1, wherein the first light-emitting element has an emission spectrum peak in greater than or equal to 450 nm and less than or equal to 510 nm, and
wherein the second light-emitting element has an emission spectrum peak in greater than or equal to 550 nm and less than or equal to 600 nm.

5. The lighting device according to claim 1, wherein each of the first light-emitting element and the second light-emitting element is a organic electroluminescence element.

6. The lighting device according to claim 1, wherein a light-emitting substance in the first light-emitting element is a fluorescent compound, and
wherein a light-emitting substance in the second light-emitting element is phosphorescent compound.

7. A lighting device comprising:
a first light-emitting element emitting first light; and
a second light-emitting element connected in parallel to the first light-emitting element, the second light-emitting element emitting second light,
wherein the second light has a longer wavelength than the first light,
wherein the second light-emitting element starts to emit the second light at a lower voltage than the first light-emitting element,
wherein the second light-emitting element emits the second light with higher luminance than the first light emitted from the first light-emitting element, and
wherein a mixed color of a color of the first light and a color of the second light is controlled by a voltage applied to the first light-emitting element and the second light-emitting element.

8. The lighting device according to claim 7, wherein the first light-emitting element and the second light-emitting element are stacked.

9. The lighting device according to claim 7, wherein the color of the first light and the color of the second light are in a relation of complementary colors.

10. The lighting device according to claim 7, wherein the first light-emitting element has an emission spectrum peak in greater than or equal to 450 nm and less than or equal to 510 nm, and
wherein the second light-emitting element has an emission spectrum peak in greater than or equal to 550 nm and less than or equal to 600 nm.

11. The lighting device according to claim 7, wherein each of the first light-emitting element and the second light-emitting element is a organic electroluminescence element.

12. The lighting device according to claim 7, wherein a light-emitting substance in the first light-emitting element is a fluorescent compound, and
wherein a light-emitting substance in the second light-emitting element is phosphorescent compound.

13. A lighting device comprising:
a plurality of first light-emitting elements each emitting first light; and
a plurality of second light-emitting elements connected in parallel to the plurality of first light-emitting elements, the plurality of second light-emitting elements each emitting second light,
wherein the second light has a longer wavelength than the first light, wherein each of the plurality of second light-emitting elements starts to emit the second light at a lower voltage than each of the plurality of first light-emitting elements, and wherein a mixed color of a color of the first light and a color of the second light is controlled by a voltage applied to the plurality of first light-emitting elements and the plurality of second light-emitting elements.

14. The lighting device according to claim 13, wherein the plurality of first light-emitting elements and the plurality of second light-emitting elements are arranged in a honeycomb structure.

15. The lighting device according to claim 13, wherein the color of the first light and the color of the second light are in a relation of complementary colors.

16. The lighting device according to claim 13, wherein each of the plurality of first light-emitting elements has an emission spectrum peak in greater than or equal to 450 nm and less than or equal to 510 nm, and wherein each of the plurality of second light-emitting elements has an emission spectrum peak in greater than or equal to 550 nm and less than or equal to 600 nm.

17. The lighting device according to claim 13, wherein each of the plurality of first light-emitting elements and the plurality of second light-emitting elements is a organic electroluminescence element.

18. The lighting device according to claim 13, wherein a light-emitting substance in each of the plurality of first light-emitting elements is a fluorescent compound, and wherein a light-emitting substance in each of the plurality of second light-emitting elements is phosphorescent compound.

19. A method for driving a lighting device comprising the step of:

applying a voltage to a first light-emitting element and a second light-emitting element connected in parallel to the first light-emitting element, so that the second light-emitting element or both of the first light-emitting element and the second light-emitting element emit light, wherein the first light-emitting element emitting first light, wherein the second light-emitting element emitting second light, wherein a mixed color of a color of the first light and a color of the second light is controlled according to the applied voltage, wherein the second light-emitting element starts to emit the second light at a lower voltage than the first light-emitting element, and wherein the second light has a longer wavelength than the first light.

20. The method for driving the lighting device according to claim 19, wherein the color of the first light and the color of the second light are in a relation of complementary colors.

* * * * *

UNITED STATES PATENT AND TRADEMARK OFFICE
CERTIFICATE OF CORRECTION

PATENT NO. : 8,610,362 B2
APPLICATION NO. : 13/298558
DATED : December 17, 2013
INVENTOR(S) : Satoshi Seo Page 1 of 1

It is certified that error appears in the above-identified patent and that said Letters Patent is hereby corrected as shown below:

In the Specification:

Column 3, line 63; Change "second, light-emitting element" to --second light-emitting element--.
Column 6, line 55; Change "of, a nitride" to --of a nitride--.
Column 6, line 65; Change "a carbon, film" to --a carbon film--.
Column 8, line 26; Change "bis(4-butylphenye-N," to --bis(4-butylphenyl)-N,--.
Column 9, line 48; Change "billuoren-2-yl)" to --bifluoren-2-yl)--.
Column 9, line 59; Change "DNA;" to --DNA,--.
Column 10, line 36; Change "difluorophenyppyridinato" to --difluorophenyl)pyridinato--.
Column 10, line 43; Change "fridium(III)" to --iridium(III)--.
Column 11, line 30; Change "(abbreviation: tris(" to --(abbreviation: Alq), tris--.
Column 13, line 10; Change "fowled by" to --formed by--.

Signed and Sealed this
Fifteenth Day of April, 2014

Michelle K. Lee
*Deputy Director of the United States Patent and Trademark Office*